US007224166B2

(12) United States Patent
Harvey et al.

(10) Patent No.: US 7,224,166 B2
(45) Date of Patent: May 29, 2007

(54) MRI SYSTEM HAVING A GRADIENT MAGNET SYSTEM WITH A GYROSCOPE

(75) Inventors: Paul Royston Harvey, Eindhoven (NL); Nicolaas Bernardus Roozen, Eindhoven (NL); Cornelis Leonardus Gerardus Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/549,057

(22) PCT Filed: Mar. 11, 2004

(86) PCT No.: PCT/IB2004/050231

§ 371 (c)(1),
(2), (4) Date: Sep. 13, 2005

(87) PCT Pub. No.: WO2004/081596

PCT Pub. Date: Sep. 23, 2004

(65) Prior Publication Data

US 2006/0192556 A1    Aug. 31, 2006

(30) Foreign Application Priority Data

Mar. 13, 2003   (EP)   ................... 03100643

(51) Int. Cl.
*G01V 3/00* (2006.01)
(52) U.S. Cl. ..................................... 324/318
(58) Field of Classification Search ......... 324/300–322
See application file for complete search history.

(56) References Cited

U.S. PATENT DOCUMENTS 5,345,177 A * 9/1994 Sato et al. ................... 324/318

(Continued)

FOREIGN PATENT DOCUMENTS

JP       93 08617       12/1997
JP     2002 017705       1/2002

OTHER PUBLICATIONS

Qiu, J., et al.; Vibration control of a cylindrical shell used in MRI equipment; 1995; Smart Mater. Struct.; 4:A75-A81.

(Continued)

*Primary Examiner*—Brij Shrivastav
*Assistant Examiner*—Dixomara Vargas
(74) *Attorney, Agent, or Firm*—Thomas M. Lundin (57) ABSTRACT

The invention relates to an MRI system (1) comprising an examination volume (11), a main magnet system (13) for generating a main magnetic (field ($B_0$) in the examination volume, a gradient magnet system (19) for generating gradients of the main magnetic field, and an anti-vibration system (39) for reducing vibrations of the gradient magnet system. According to the invention the anti-vibration system comprises a gyroscope (41) which is mounted to the gradient magnet system. As a result of the gyroscopic effect of the gyroscope, the vibrations of the gradient magnet system are effectively reduced. In an open type MRI system (1) according to the invention, a separate gyroscope (41, 43) is mounted to each of the two portions (21, 23) of the gradient magnet system (19), and each gyroscope has an axis of rotation (61) parallel to the main direction (Z) of the main magnetic field ($B_0$).

7 Claims, 3 Drawing Sheets

U.S. PATENT DOCUMENTS

| | | |
|---|---|---|
| 5,617,026 A | 4/1997 | Yoshino |
| 6,894,498 B2 * | 5/2005 | Edelstein .................... 324/318 |
| 6,906,517 B1 * | 6/2005 | Huang et al. ............... 324/315 |
| 6,933,722 B2 * | 8/2005 | Tsuda et al. ................ 324/318 |
| 2005/0283964 A1 * | 12/2005 | Mao et al. .................... 29/458 |

OTHER PUBLICATIONS

Cho, Z.H., et al.; A New Silent Magnetic Resonance Imaging Using a Rotating DC Gradient; 1998; MRM; 39:317-321.

* cited by examiner

MRI SYSTEM HAVING A GRADIENT MAGNET SYSTEM WITH A GYROSCOPE

The invention relates to a magnetic resonance imaging (MRI) system comprising an examination volume, a main magnet system for generating a main magnetic field in the examination volume, a gradient magnet system for generating gradients of the main magnetic field, and anti-vibration system for reducing vibrations of the gradient magnet system.

An MRI system of the kind mentioned in the opening paragraph is known from U.S. Pat. No. 5,617,026. The known MRI system is used to make images of the entrails of a patient's body by means of a nuclear magnetic resonance method. In the known MRI system the main magnet system comprises a number of superconducting electric coils which are accommodated in a cryogenic container. Thus the main magnetic field generated by the main magnet system is relatively strong, as a result of which strong nuclear magnetic resonance effects are achieved. The gradient magnet system comprises a number of electric coils for generating gradients of the main magnetic field in three orthogonal directions. An image of the patient's body is constructed by successively observing nuclear magnetic resonance effects in a large number of positions in the patient's body, which are successively selected by altering said gradients. To achieve an acceptable overall time necessary for the examination, the gradients of the main magnetic field are altered at relatively high frequencies, as a result of which the electric currents in the coils of the gradient magnet system also alter at high frequencies.

As a result of electromagnetic interaction between the magnetic field of the main magnet system and the altering electric currents in the gradient magnet system, altering mechanical loads, in particular Lorentz forces, are exerted on the gradient magnet system during operation of the known MRI system. Without additional measures said mechanical loads would result in mechanical and acoustic vibrations of the gradient magnet system, and said vibrations would result in distortions of the images generated by the MRI system and in inadmissibly strong acoustic noise in the examination volume and around the MRI system. The known MRI system comprises an anti-vibration system for reducing said vibrations of the gradient magnet system. The anti-vibration system comprises a plurality of piezo-electric devices which are embedded in the cylindrical carrier of the coils of the gradient magnet system. During operation said piezo-electric devices are energized in such a manner that local deformations of the carrier, which are caused by the altering mechanical loads exerted on the coils of the gradient magnet system, in particular the Lorentz forces, are cancelled by compensating deformations of the piezo-electric devices. Although the mechanical and acoustic vibrations of the gradient magnet system are reduced to some extent as a result of said compensating deformations, the level of the residual mechanical and acoustic vibrations of the gradient magnet system of the known MRI system is still considerable. Another disadvantage of the known MRI system is that the piezo-electric devices of the anti-vibration system need to be controlled by a control system, as a result of which the constitution of the known MRI system is rather complex.

It is an object of the invention to provide a magnetic resonance imaging (MRI) system of the kind mentioned in the opening paragraph with an anti-vibration system, which has a simpler constitution and by means of which the mechanical and acoustic vibrations caused by altering mechanical loads exerted on the gradient magnet system are further reduced.

To achieve said object, a magnetic resonance imaging (MRI) system according to the invention is characterized in that the anti-vibration system comprises a gyroscope which is mounted to the gradient magnet system. The gyroscope comprises a balance member which is rotatably journalled relative to the gradient magnet system about an axis of rotation of the gyroscope. The gyroscope further comprises an electric motor for rotating the balance member about the axis of rotation, a stator of the electric motor being arranged in a fixed position relative to the gradient magnet system and a rotor of the electric motor being arranged in a fixed position relative to the balance member. During operation the balance member is rotated about the axis of rotation at a relatively high angular speed. When a mechanical load is exerted on the gradient magnet system, in particular a Lorentz force which is the result of electromagnetic interaction between the magnetic field of the main magnet system and the electric currents in the gradient magnet system, said mechanical load leads to a mechanical torque about the center of gravity of the combined system of the gradient magnet system and the gyroscope. As a result of the gyroscopic effect, angular movements of said combined system about said center of gravity caused by a component of said mechanical torque directed perpendicularly to the axis of rotation of the gyroscope (called "perpendicular component" in the following) will be considerably limited. The gyroscopic effect further results in a so-called precessional movement of said combined system, which is an angular movement of the combined system about an axis of rotation directed perpendicularly to the axis of rotation of the gyroscope and perpendicularly to the perpendicular component of the mechanical torque. However, said precessional movement is small relative to the movement which would be caused by the mechanical load if the gyroscope were not present. It was found that, with suitable values of the moment of inertia and the angular speed of the balance member and with a suitable direction of the axis of rotation of the balance member, the vibrations of the combined system of the gradient magnet system and the gyroscope, caused by the altering Lorentz forces exerted on the gradient magnet system, are reduced to such a level that the acoustic noise of the MRI system and the distortions of the generated images caused by said vibrations are at an acceptably low level. Since the anti-vibration system comprises said gyroscope, i.e. a rotatable balance member and an electric motor, the anti-vibration system in addition has a comparably simple structure.

A particular embodiment of an MRI system according to the invention is characterized in that the examination volume is present between a first magnet unit and a second magnet unit which are arranged at a distance from each other, wherein the first and the second magnet unit comprise a first portion and a second portion, respectively, of the main magnet system and a first portion and a second portion, respectively, of the gradient magnet system, and wherein the anti-vibration system comprises a first gyroscope, which is mounted to the first portion of the gradient magnet system, and a second gyroscope, which is mounted to the second portion of the gradient magnet system, the first and the second gyroscope each having an axis of rotation which is directed parallel to a main Z-direction of the main magnetic field. In this particular embodiment the MRI system is of a so-called open type, wherein the examination volume is easily accessible for the patient and for the medical personnel as a result of the fact that the main magnet system and the gradient magnet system are accommodated in two separate magnet units at a distance from each other, as seen in the Z-direction. This particular embodiment of the invention is based on the insight that in an open-type MRI system the mechanical and acoustic vibrations of the gradient magnet system are predominantly caused by mechanical torques exerted on the first and the second portion of the gradient magnet system about axes perpendicular to the Z-direction as a result of the electromagnetic interaction between the main magnetic field and the electric currents in the gradient magnet system. As in this embodiment separate gyroscopes are mounted to the first and the second portion of the gradient magnet system, wherein the gyroscopes each have an axis of rotation which is directed parallel to the Z-direction, the vibrations of the first and the second portion of the gradient magnet system, caused by said mechanical torques about axes perpendicular to the Z-direction, are considerably limited as a result of the gyroscopic effect of the gyroscopes. In this manner, a predominant portion of the mechanical and acoustic vibrations of the two portions of the gradient magnet system is effectively reduced and, with suitable values of the moments of inertia and the angular speeds of the gyroscopes, the vibrations of the gradient magnet system are reduced to such a level that the acoustic noise of the open MRI system and the distortions of the generated images caused ay said vibrations are at an acceptably low level.

A further embodiment of an MRI system according to the invention is characterized in that, for each gyroscope, a moment of inertia $J_Z$ about the axis of rotation and, during operation, an angular velocity $\omega_Z$ are such that the product $J_Z^* \omega_Z$ is substantially larger than $2\pi^* J_X^* f_{EXC}$, wherein $J_X$ is a total moment of inertia of the respective portion of the gradient magnet system and the respective gyroscope about an axis perpendicular to the axis of rotation, and $f_{EXC}$ is a frequency of the vibrations to be reduced of the respective portion of the gradient magnet system. As a result, an effective reduction of vibrations of the gradient magnet system for frequencies up to $f_{EXC}$ is achieved, and gyroscopic resonance effects are avoided for frequencies up to $f_{EXC}$.

A further embodiment of an MRI system according to the invention is characterized in that the first and the second portion of the gradient magnet system each comprise a support, which carries a coil system and which is accommodated in a portion of, respectively, the first and the second magnet unit facing the examination volume, the first and the second gyroscope being arranged at a side of, respectively, the first and the second magnet unit remote from the examination volume and being mounted to, respectively, the first and the second portion of the gradient magnet system by means of a mounting member which is accommodated in a central passage provided in, respectively, the first portion and the second portion of the main magnet system. At the side of each respective magnet unit remote from the examination volume, a relatively large amount of space is available to position the respective gyroscope. At this side, in particular, the rotatable portion of the respective gyroscope can be arranged at a relatively large distance from the axis of rotation of the gyroscope, so that a relatively large moment of inertia of the gyroscope is achieved with a limited total mass of the gyroscope. In this manner, the gyroscope provides a relatively strong gyroscopic effect, so that a relatively strong reduction of the vibrations of the respective portion of the gradient magnet system is achieved.

A further embodiment of an MRI system according to the invention is characterized in that the first and the second portion of the gradient magnet system each comprise a support, which carries a coil system and which is accommodated in a portion of, respectively, the first and the second magnet unit facing the examination volume, the first and the second gyroscope being arranged in the support of, respectively, the first and the second portion of the gradient magnet system. Since each gyroscope is arranged in the support of the respective portion of the gradient magnet system, a relatively short distance is present between the respective gyroscope and the coil system of the respective portion of the gradient magnet system on which the Lorentz forces are exerted during operation. In this manner, a relatively rigid structure of the combined system of the respective portion of the gradient magnet system and the respective gyroscope is achieved, as a result of which internal mechanical resonance frequencies of said combined system are avoided as much as possible.

A particular embodiment of an MRI system according to the invention is characterized in that the gyroscope is coupled to the gradient magnet system by means of an actuator system and a coupling device allowing displacements of the gyroscope relative to the gradient magnet system, the MRI system having a control system for controlling the actuator system in such a manner that, during operation, the actuator system exerts upon the gradient magnet system, a compensating mechanical load which reduces residual vibrations of the gradient magnet system. As a result of the compensating mechanical load exerted by the actuator system, both residual angular movements of the gradient magnet system, caused by the perpendicular component of the mechanical torque exerted on the gradient magnet system, and the precessional movement of the gradient magnet system are further reduced or even substantially prevented. The compensating mechanical load to be exerted on the gradient magnet system is determined by the control system, for example, by means of a sensor system which measures the residual vibrations of the gradient magnet system. Alternatively or in combination with said sensor system, the compensating mechanical load may be determined by the control system in a feed-forward manner on the basis of the pre-determined values of the currents in the gradient magnet system, the mechanical properties of the gradient magnet system, and the mechanical and gyroscopic properties of the gyroscope. The actuator system exerts, upon the gyroscope, a mechanical reaction load which is equal but opposite to said compensating mechanical load. The coupling device is such that it provides sufficient freedom of movement of the gyroscope relative to the gradient magnet system, so that said mechanical reaction load is completely converted into displacements of the gyroscope relative to the gradient magnet system. Preferably, the gyroscope has a sufficiently large mass and/or moment of inertia, so that the resulting displacements and vibrations of the gyroscope are limited as much as possible.

A further embodiment of an MRI system according to the invention is characterized in that the first and the second gyroscope are coupled to, respectively, the first and the second portion of the gradient magnet system by means of a separate actuator system and a separate coupling device allowing at least rotations of the respective gyroscope relative to the respective portion of the gradient magnet system about a first and a second axis of rotation, which extend perpendicularly to each other and to the Z-direction, the MRI system having a control system for controlling each actuator system in such a manner that, during operation, each actuator system exerts, upon the respective portion of the gradient magnet system, at least compensating mechanical torques about the first and the second axis of rotation which reduce residual vibrations of the respective portion of the gradient magnet system. In this manner, in an open MRI system, residual angular movements of the first and second portion of the gradient magnet system about axes perpendicular to the Z-direction, caused by a predominant portion of the Lorentz forces exerted on the first and the second portion of the gradient magnet system, as well as the precessional movements of the first and the second portion of the gradient magnet system are further reduced or even substantially prevented.

In the following, embodiments of a magnetic resonance imaging (MRI) system in accordance with the invention will be described in detail with reference to the figures, in which FIG. 1 schematically shows a cross-section of a first embodiment of an MRI system according to the invention, FIG. 2 schematically shows a cross-section of a portion of a second embodiment of an MRI system according to the invention, and FIG. 3 schematically shows a cross-section of a portion of a third embodiment of an MRI system according to the invention.

Figure 1:
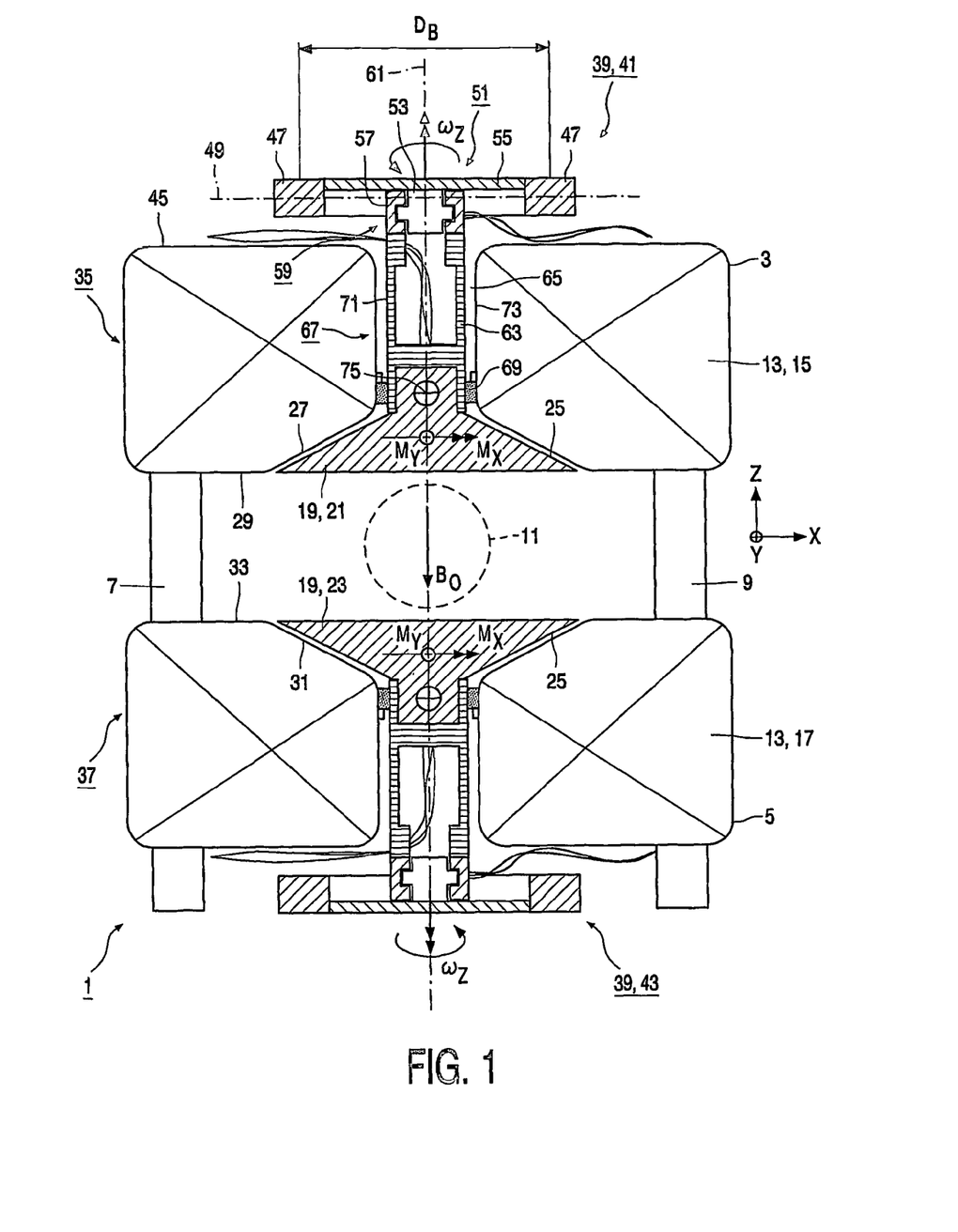

The first embodiment of an MRI system 1 according to the invention shown in FIG. 1 is of the so-called open type and has an upper housing 3 and a lower housing 5 which are interconnected by means of two vertical posts 7, 9. Between the upper housing 3 and the lower housing 5 an examination volume 11 is present in which a patient to be examined can be positioned. The MRI system 1 further comprises a main magnet system 13 having a first portion 15 accommodated in the upper housing 3 and a second portion 17 accommodated in the lower housing 5. Said first and second portion 15, 17, which are not shown in detail in FIG. 1, each comprise a number of superconducting electric coils accommodated in a cryogenic container. By means of the main magnet system 13 a main magnetic field $B_0$ is generated in the examination volume 11 during operation, which main magnetic field $B_0$ is mainly directed in a vertical Z-direction. The MRI system 1 further comprises a gradient magnet system 19 having a first portion 21, which is arranged between the first portion 15 of the main magnet system 13 and the examination volume 11, and a second portion 23, which is arranged between the second portion 17 of the main magnet system 13 and the examination volume 11. Said first and second portion 21, 23 each comprise a conical support 25 carrying an electric coil system, which is not shown in detail in FIG. 1, for generating gradients of the main magnetic field $B_0$ in the examination volume 11 in three orthogonal directions X, Y, Z. The support 25 of the first portion 21 is accommodated with clearance in a conical recess 27 provided in the upper housing 3 at a side 29 of the upper housing 3 facing the examination volume 11, while the support 25 of the second portion 23 is accommodated with clearance in a conical recess 31 provided in the lower housing 5 at a side 33 of the lower housing 5 facing the examination volume 11. The first portion 15 of the main magnet system 13 and the first portion 21 of the gradient magnet system 19 belong to a first magnet unit 35 accommodated in the upper housing 3, while the second portion 17 of the main magnet system 13 and the second portion 23 of the gradient magnet system 19 belong to a second magnet unit 37 accommodated in the lower housing 5 at a vertical distance from the first magnet unit 35. Further, the first magnet unit 35 and the second magnet unit 37 each comprise an RF-coil unit not shown in detail in FIG. 1.

The MRI system 1 is suitable to make images of the entrails of a patient's body by means of a nuclear magnetic resonance method. An image of the patient's body is constructed by successively observing nuclear magnetic resonance effects in a large number of positions in the patient's body, which are successively selected by altering the gradients of the main magnetic field $B_0$. In each selected position an RF-signal is transmitted by the RF-coil units and subsequently an RF-signal, which is generated as a result of a nuclear magnetic resonance effect in said position, is received by the RF-coil units. Since the main magnet system 13 comprises superconducting electric coils, the main magnetic field $B_0$ is relatively strong, so that relatively strong nuclear magnetic resonance effects are achieved. In order to limit the overall time necessary for a complete examination, the gradients of the main magnetic field $B_0$ are altered at relatively high frequencies. For this purpose the electric currents in the coil systems of the gradient magnet system 19 are also altered at high frequencies.

Since a portion of the magnetic field of the main magnet system 13 is present in the gradient magnet system 19, an electromagnetic interaction occurs between the magnetic field of the main magnet system 13 and the altering currents in the gradient magnet system 19. Said interaction leads to mechanical loads, in particular Lorentz forces being exerted during operation on the coil systems of the gradient magnet system 19. Since the magnetic field of the main magnet system 13 is relatively strong and the currents in the gradient magnet system 19 are altered at relatively high frequencies, the Lorentz forces are relatively high. Without additional measures the Lorentz forces would lead to strong mechanical and acoustic vibrations of the gradient magnet system 19. Said vibrations would even be transmitted to other parts of the MRI system 1, in particular to the main magnet system 13 and to the upper and lower housing 3, 5. As a result of said vibrations, distortions of the main magnetic field $B_0$ would occur, which would result in inadmissible distortions of the images generated by the MRI system 1. Furthermore, inadmissibly high acoustic vibrations would occur in and around the MRI system 1.

In order to limit said mechanical and acoustic vibrations of the gradient magnet system 19, the MRI system 1 comprises an anti-vibration system 39. In the first embodiment of the MRI system 1 shown in FIG. 1 the anti-vibration system 39 comprises a first gyroscope 41, which is mounted to the first portion 21 of the gradient magnet system 19 for limiting the vibrations of said first portion 21, and a second gyroscope 43 which is mounted to the second portion 23 of the gradient magnet system 19 for limiting the vibrations of said second portion 23. In the following only the first gyroscope 41 of the anti-vibration system 39 will be discussed in detail. The structure and operation of the second gyroscope 43 of the anti-vibration system 39 is identical to the first gyroscope 41. Furthermore a number of structural details of the first portion 21 of the gradient magnet system 19 will be discussed, and it will be clear that the second portion 23 of the gradient magnet system 19 has identical structural details.

As shown in FIG. 1, the first gyroscope 41 of the anti-vibration system 39 is arranged at a side 45 of the upper housing 3 remote from the examination volume 11. The first gyroscope 41 comprises an annular balance member 47 which extends in an imaginary plane 49 perpendicularly to the Z-direction. The first gyroscope 41 further comprises an electric motor 51 comprising a rotor 53, which is mounted in a fixed position relative to the balance member 47 via a disc-shaped mounting element 55, and a stator 57, which is mounted in a fixed position relative to the first portion 21 of the gradient magnet system 19. The motor 51 has a bearing 59, in the embodiment shown a fluid dynamic groove-bearing not shown in detail in FIG. 1, by means of which the balance member 47 is rotatably journalled relative to the first portion 21 of the gradient magnet system 19 about an axis of rotation 61 of the first gyroscope 41 extending parallel to the Z-direction. The stator 57 of the motor 51 of the first gyroscope 41 is mounted to the conical support 25 of the first portion 21 of the gradient magnet system 19 by means of a mainly circularly cylindrical mounting member 63. Said mounting member 63 is accommodated in a central passage 65 which is provided in the first portion 15 of the main magnet system 13. The first portion 21 of the gradient magnet system 19 and the first gyroscope 41 thus constitute a combined system 67, which is mounted to the first portion 15 of the main magnet system 13 via an annular suspension element 69 mounted to an external surface 71 of the mounting member 63 and to an internal surface 73 of the central passage 65. The suspension element 69 is made from an elastically deformable material, for example rubber, and has a position in the Z-direction corresponding to a position in the Z-direction of a center of gravity 75 of the combined system 67.

In the open-type MRI system 1 the mechanical and acoustic vibrations of the first portion 21 and the second portion 23 of the gradient magnet system 19 are predominantly caused by mechanical torques $M_X$, $M_Y$ (see FIG. 1), which are exerted on said first and second portions 21, 23 about axes directed perpendicularly to the Z-direction as a result of the electromagnetic interaction between the magnetic field of the main magnet system 13 and the electric currents in the coil systems of said first and second portions 21, 23. As a result of the use of the first and second gyroscopes 41, 43, a gyroscopic effect is achieved which considerably limits the vibrations of said first and second portions 21, 23 caused by the mechanical torques $M_X$ and $M_Y$ as will be explained now for the first portion 21. It will be clear that the effect is similar for the second portion 23.

During operation the balance member 47 of the first gyroscope 41 is rotated about the axis of rotation 61 by means of the motor 51 at a comparatively high angular speed $\omega_Z$. The balance member 47 has a comparatively large moment of inertia $J_Z$ about the axis of rotation 61. This is achieved as a result of the fact that the first gyroscope 41 is arranged at the side 45 of the first housing 3, where a comparatively large amount of space is available for arranging the first gyroscope 41. In particular, the annular balance member 47 has a comparatively large diameter $D_B$, so that a comparatively large moment of inertia $J_Z$ is achieved with a comparatively small mass of the balance member 47. As a result, the rotating balance member 47 has a comparatively large angular momentum $J_Z*\omega_Z$, so that the first gyroscope 41 provides a strong gyroscopic effect.

When a mechanical torque $M_X$ is exerted on the first portion 21 of the gradient magnet system 19, said gyroscopic effect leads to a strong reduction of the vibrations of the first portion 21 which would be caused by the mechanical torque $M_X$ in the absence of the first gyroscope 41. Said reduction is a result of the fact that the axis of rotation 61 of the first gyroscope 41 extends perpendicularly to the direction of the mechanical torque $M_X$. A similar reduction is obtained for vibrations caused by the mechanical torque $M_Y$, because the axis of rotation 61 of the first gyroscope 41 is also perpendicular to the direction of the mechanical torque $M_Y$. The gyroscopic effect further inevitably leads to a so-called precessional movement. The precessional movement resulting from the altering mechanical torque $M_X$ is an angular vibration of the combined system 67 about an axis which is parallel to the Y-direction, while the precessional movement resulting from the altering mechanical torque $M_Y$ is an angular vibration of the combined system 67 about an axis which is parallel to the X-direction. However, said precessional movements are relatively small, and the sum of said precessional movements and the residual vibrations directly resulting from the mechanical torques $M_X$ and $M_Y$ is considerably smaller than the vibrations of the first portion 21, which would be caused by the mechanical torques $M_X$ and $M_Y$ in the absence of the first gyroscope 41. It was found that, with suitable values of the moment of inertia $J_Z$ and the angular speed $\omega_Z$ of the balance member 47, the vibrations of the first portion 21 of the gradient magnet system 19, caused by the altering Lorentz forces exerted on said first portion 21, are reduced to such a level that the acoustic noise of the MRI system 1 and the distortions of the generated images caused by said vibrations are at an acceptably low level.

Typically, in the embodiment shown in FIG. 1, the mechanical torques $M_X$ and $M_Y$ have a peak amplitude of approximately 600 Nm at a frequency of approximately 25 Hz, and predominant amplitudes of the mechanical torques $M_X$ and $M_Y$ occur at frequencies up to 100 Hz. It was found that, in order to achieve an effective reduction of the vibrations caused by these predominant torques, the angular momentum $J_Z*\omega_Z$ of the balance member 47 should be substantially larger than $2\pi*J_X*f_{EXC}$, wherein $J_X$ is a moment of inertia of the combined system 67 about an axis perpendicular to the axis of rotation 61, and $f_{EXC}$ is a maximum frequency of the vibrations to be reduced. In the embodiment of FIG. 1 typical values may be, for example, $J_X$=11 kg.m², $J_Z$=110 kg.m² and $\omega_Z$=100 rad/s. These values result in an effective reduction of the vibrations caused by mechanical torques $M_X$ and $M_Y$ up to approximately 100 Hz. With these values and for $f_{EXC}$=25 Hz, for example, a reduction of approximately 98% is achieved for the vibrations directly resulting from the torques $M_X$ and $M_Y$, while the precessional vibrations have an amplitude of approximately 15% of the amplitude which the vibrations would have in the absence of the gyroscope 41. Higher reductions can be obtained using a higher angular momentum of the gyroscope. When $J_Z*\omega_Z$ is substantially larger than $2\pi*J_X*f_{EXC}$, it is achieved that gyroscopic resonance effects are avoided, which typically occur when the excitation frequency $f_{EXC}$ is approximately $J_Z*\omega_Z/(2\pi*J_X)$. The expression "substantially larger" typically means "a factor of 1.5 larger or more". It is noted that the above mentioned values only are an example of typical values, and that the skilled person will be able to find suitable values for $J_Z$ and $\omega_Z$ which are adapted to the properties of a specific MRI system.

Figure 2:
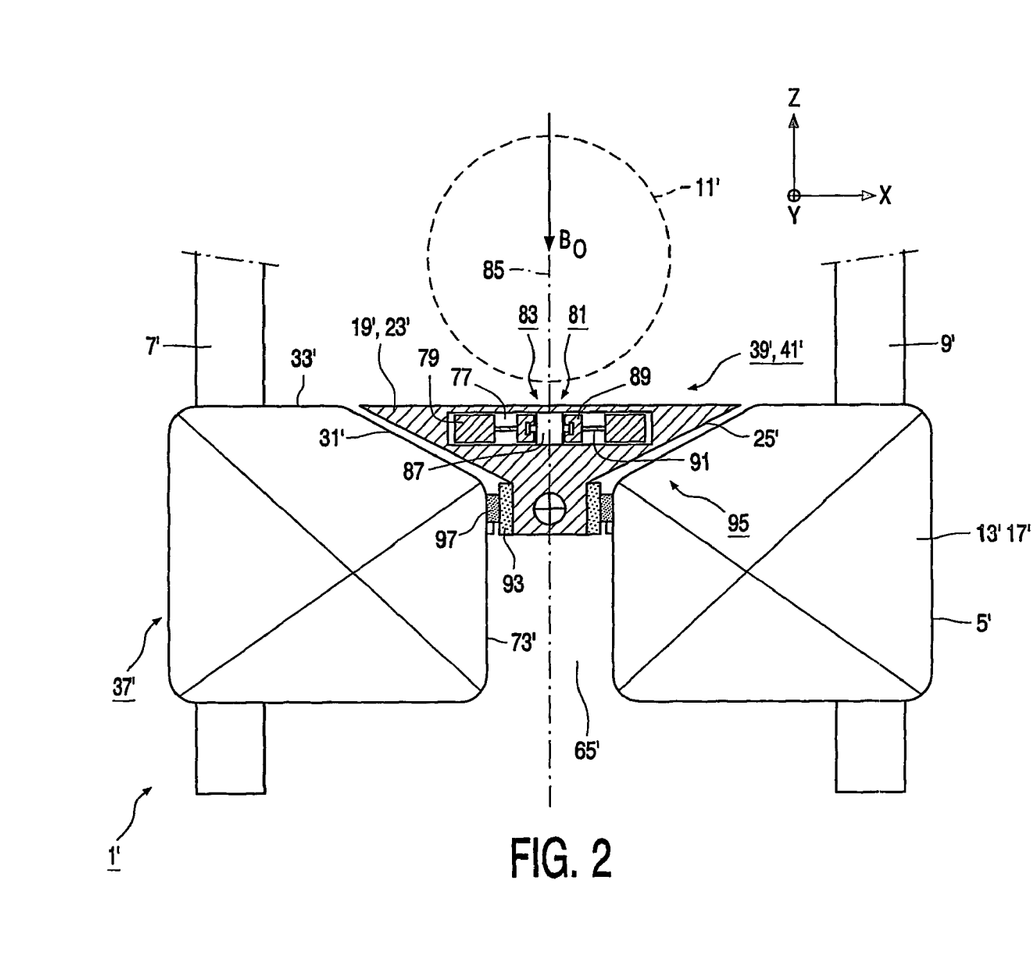

FIG. 2 schematically shows a second embodiment of an MRI system 1' according to the invention, which is also of the open type. Parts of the MRI system 1' which correspond with parts of the MRI system 1 as described before, are indicated by means of corresponding reference numbers in FIG. 2 and will not be discussed in detail. FIG. 2 schematically shows the main parts in the lower housing 5' accommodating the second magnet unit 37' of the MRI system 1'. The upper housing accommodating the first magnet unit is not shown in FIG. 2, but the skilled person will understand that the upper housing and the first magnet unit are substantially identical to the lower housing 5' and the second magnet unit 37'. In the following only the main differences between the MRI system 1' and the MRI system 1 will be briefly discussed.

Like the MRI system 1 described before, the MRI system 1' comprises an anti-vibration system 39' having a first gyroscope (not visible in FIG. 2), which is mounted to the first portion (not visible in FIG. 2) of the gradient magnet system 19', and a second gyroscope 43' which is mounted to the second portion 23' of the gradient magnet system 19'. As shown in FIG. 2, the main difference between the MRI system 1' and the MRI system 1 is that the second gyroscope 43' is arranged in the conical support 25' of the second portion 23' of the gradient magnet system 19'. For this purpose, the support 25' is provided with a central chamber 77. The second gyroscope 43' comprises an annular balance member 79, an electrical motor 81, and a bearing 83 defining an axis of rotation 85 of the second gyroscope 43' directed parallel to the Z-direction. The motor 81 has a stator 87, which is mounted in a fixed position in the chamber 77, and a rotor 89, which is mounted in a fixed position relative to the balance member 79 via an annular mounting member 91. The conical support 25' further comprises an annular mounting member 93 mounted in a fixed position to said support 25'. The second portion 23' of the gradient magnet system 19' and the second gyroscope 43' constitute a combined system 95, which is mounted to the second portion 17' of the main magnet system 13' via an annular suspension element 97 mounted to the mounting member 93 and to an internal surface 73' of the central passage 65' of said second portion 17'. The operation and effect of the second gyroscope 43' are substantially identical to the operation and effect of the first gyroscope 41 of the MRI system 1 as described before. Since the coils of the coil system (not shown in FIG. 2) of the second portion 23' of the gradient magnet system 19' are provided on the outer surface of the conical support 25', only a comparatively short distance is present between the second gyroscope 43' and said coil system, i.e. the location where the Lorentz forces acting on said second portion 23' have their points of application. As a result, a comparatively rigid structure of the combined system 95 is achieved, so that internal mechanical resonance frequencies of said combined system 95 are avoided as much as possible.

Figure 3:
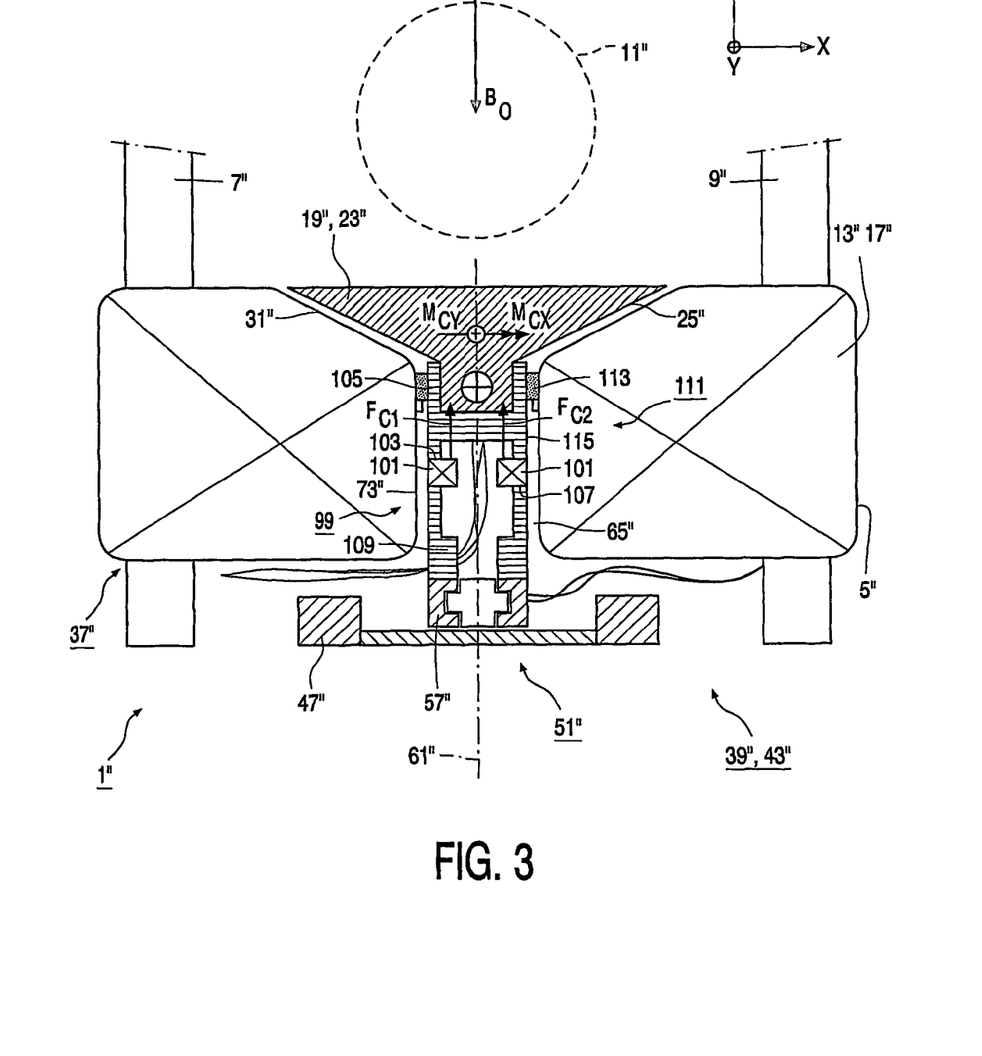

FIG. 3 schematically shows a third embodiment of an MRI system 1" according to the invention, which is also of the open type. Parts of the MRI system 1" which correspond with parts of the MRI system 1 as described before, are indicated by means of corresponding reference numbers in FIG. 3 and will not be discussed in detail. FIG. 3 schematically shows the main parts in the lower housing 5" accommodating the second magnet unit 37" of the MRI system 1". The upper housing accommodating the first magnet unit is not shown in FIG. 3, but the skilled person will understand that the upper housing and the first magnet unit are substantially identical to the lower housing 5" and the second magnet unit 37". In the following only the main differences between the MRI system 1" and the MRI system 1 will be briefly discussed.

Like the MRI system 1 described before, the MRI system 1" comprises an anti-vibration system 39" having a first gyroscope (not visible in FIG. 3), which is mounted to the first portion (not visible in FIG. 3) of the gradient magnet system 19", and a second gyroscope 43" which is mounted to the second portion 23" of the gradient magnet system 19". As shown in FIG. 3, the main difference between the MRI system 1" and the MRI system 1 is that the second gyroscope 43", i.e. the stator 57" of the electric motor 51", is not mounted in a fixed position relative to the conical support 25" of the second portion 23", like the stator 57 of the motor 51 in the MRI system 1, but is coupled to said support 25" by means of an actuator system 99 by means of which the second gyroscope 43" can be displaced relative to said support 25". In the embodiment shown in FIG. 3 the actuator system 99 comprises three piezo-electric actuators 101 which each have a main direction of deformation parallel to the Z-direction. It is noted that FIG. 3 schematically shows only two of the three actuators 101. The three actuators 101 are arranged at regular intervals on an imaginary circle around the axis of rotation 61" of the second gyroscope 43", the actuators 101 being mounted to a lower mounting surface 103 of a first circularly cylindrical mounting member 105, which is rigidly mounted to the support 25", and to an upper mounting surface 107 of a second circularly cylindrical mounting member 109, which is rigidly mounted to the stator 57" of the motor 51". The second portion 23" of the gradient magnet system 19", the first mounting member 105, the actuator system 99, the second mounting member 109 and the second gyroscope 43" together constitute a combined system 111, which is mounted to the second portion 17" of the main magnet system 13" by means of an annular elastically deformable mounting element 113 which is mounted to an external surface 115 of the first mounting member 105 and to the internal surface 73" of the central passage 65". During operation, the actuators 101 exert compensating mechanical forces $F_{C1}, F_{C2}, F_{C3}$ on the second portion 23" of the gradient magnet system 19", which are each directed parallel to the Z-direction, so that the actuator system 99 exerts compensating mechanical torques $M_{CX}$, $M_{CY}$ upon said second portion 23" about, respectively, a first axis of rotation, which extends parallel to the X-direction, and a second axis of rotation, which extends parallel to the Y-direction. Furthermore, a coupling device is provided between the second gyroscope 43" and the support 25", which allows rotations of the second gyroscope 43" and the second portion 23" relative to each other about said first and second axes of rotation and linear displacements of the second gyroscope 43" and the support 25" relative to each other in the Z-direction and which prevents rotations of the second gyroscope 43" and the second portion 23" relative to each other about an axis of rotation parallel to the Z-direction and linear displacements of the second gyroscope 43" and the support 25" relative to each other in the X-direction and the Y-direction. Said coupling device is not shown in FIG. 3 for the sake of simplicity, but the skilled person will be able to design a suitable coupling device having the properties mentioned before, for example a coupling device comprising a suitable number of elastically deformable coupling rods. It is noted that the invention also encloses embodiments in which the actuator system constitutes or comprises the necessary coupling device, provided that the actuator system provides sufficient stiffness in the X- and Y-directions and in the angular direction around the Z-direction.

The three actuators 101 are controlled by means of a control system of the MRI system 1", which is not shown in FIG. 3 for the sake of simplicity. As mentioned before, the vibrations of the first and second portions 21, 23 of the gradient magnet system 19 of the MRI system 1 cannot be completely neutralized by means of the first and second gyroscopes 41, 43 as a result of the inevitable precessional movements linked up with the gyroscopic effects of the first and second gyroscopes 41, 43. In the MRI system 1" said control system determines the compensating mechanical torques $M_{CX}$, $M_{CY}$ exerted by the actuator system 99 upon the second portion 23" of the gradient magnet system 19" in such a manner that residual angular vibrations of said second portion 23" about said first and second axes of rotation, which directly result from the Lorentz forces exerted on the second portion 23" and from said precessional movements, are further reduced or even prevented. For this purpose, the second portion 23" is provided with sensors which measure the residual vibrations of the second portion 23" and which supply a measuring signal corresponding with the measured residual vibrations to the control system. The control system comprises a feed-back control loop which determines the necessary compensating mechanical torques $M_{CX}$, $M_{CY}$ in such a manner that the measured residual vibrations are limited to the desired level. Alternatively or in combination with said sensors, the control system may comprise a feed-forward control loop which determines the necessary compensating mechanical torques $M_{CX}$, $M_{CY}$ on the basis of the electric currents in the coil system of the second portion 23". As the gradients of the main magnetic field $B_0$ are to be set according to a predetermined sequence controlled by a sequence control unit of the MRI system 1", the necessary currents in the second portion 23" are predetermined, so that the Lorentz forces exerted on the second portion 23" can be predicted by the control system. On the basis of the predicted Lorentz forces, the mechanical properties of the second portion 23" and the combined system 111, and the gyroscopic properties of the second gyroscope 43', the control system predicts the mechanical torques $M_{CX}$, $M_{CY}$ necessary to compensate the residual vibrations of the second portion 23".

As a result of the fact that the actuator system 99 exerts said compensating mechanical torques $M_{CX}$, $M_{CY}$ upon the second portion 23" of the gradient magnet system 19", the actuator system 99 exerts a mechanical reaction load upon the second gyroscope 43" which is equal but opposite to said compensating mechanical torques $M_{CX}$, $M_{CY}$. As a result, the gyroscope 43" will angularly vibrate relative to the second portion 23" about said first and second axes of rotation, said angular vibrations being allowed by the coupling device provided between the second portion 23" and the second gyroscope 43". Since the second gyroscope 43" is solely coupled to the second portion 23", the vibrations of the second gyroscope 43" will not be transmitted to other portions of the MRI system 1" such as the main magnet system 13. Since the balance member 47" of the second gyroscope 43" has a comparatively large mass, said vibrations of the second gyroscope 43" will be comparatively small and will in general not lead to unacceptably high acoustic noise in and around the MRI system 1". However, in order to limit the acoustic noise of the vibrating and rotating second gyroscope 43", the second gyroscope 43" may for example be arranged in a vacuum chamber.

It is noted that the invention is not limited to MRI systems of the open type as in the embodiments described before, but also covers, for example, MRI systems of the so-called closed cylindrical type which comprise a single cylindrical magnet unit enclosing a cylindrical examination volume. The gradient magnet system of an MRI system of the closed cylindrical type usually comprises a single cylindrical gradient coil system. Accordingly the anti-vibration system of a closed type MRI system according to the invention may comprise a single gyroscope only, which is mounted to said cylindrical gradient coil system. In order to compensate internal mechanical bending torques, which are characteristic of the gradient magnet system of a closed-type MRI system, a closed-type MRI system may also be provided with two or more gyroscopes mounted to the single cylindrical gradient magnet system.

In the MRI systems 1, 1' and 1" described before the anti-vibration systems 39, 39' and 39" are used to limit the vibrations of the gradient magnet system 19, 19', 19" caused by the mechanical torques $M_X, M_Y$. It is noted that the invention is not limited to such embodiments and also covers MRI systems in which the anti-vibration system is used to cancel other kinds of mechanical loads exerted on the gradient magnet system. On the basis of the description given herebefore, a person skilled in the art will be able to determine the optimum number of gyroscopes and the optimum direction of the axis of rotation of each gyroscope in dependence on the characteristics of the mechanical loads typical of the MRI system in which the anti-vibration system is to be applied. In particular, two or more gyroscopes having mutually different directions of the axis of rotation may be used in dependence on said characteristics. If in such an alternative embodiment an additional actuator system and coupling device are used to exert a compensating mechanical load on the gradient magnet system, a person skilled in the art will be able to determine a suitable constitution of the actuator system and coupling device in dependence on said characteristics.

It is further noted that the invention also covers embodiments of an open MRI system in which the first and second portions of the gradient magnet system are provided with supports for their coil systems having another shape than the conical shape as used in the MRI systems 1, 1', 1" described before. The supports may for example have the shape of a disc.

It is further noted that an actuator system for exerting a compensating mechanical load on the gradient magnet system may also be used in the MRI system 1', in which the first and second gyroscopes 41', 43' of the anti-vibration system 39' are arranged in the supports 25'. It is finally noted that the motors 51, 51', 51" and the bearings 59, 83 may be of any suitable kind. The motors 51, 51', 51" may be, for example, brushless DC-motors or pressurized air motors. A simple structure is achieved if the motors 51, 51', 51" are constituted as so-called $B_0$-motors which do not have permanent magnets, but which make use of the permanent magnetic field of the main magnet system 13, 13', 13".

The invention claimed is:

1. A magnetic resonance imaging (MRI) system comprising an examination volume, a main magnet system for generating a main magnetic field in the examination volume, a gradient magnet system for generating gradients of the main magnetic field, and an anti-vibration system for reducing vibrations of the gradient magnet system, wherein the anti-vibration system comprises a gyroscope which is mounted to the gradient magnet system.

2. An MRI system as claimed in claim 1, wherein the examination volume is present between a first magnet unit and a second magnet unit which are arranged at a distance from each other, wherein the first and the second magnet unit comprise a first portion and a second portion, respectively, of the main magnet system and a first portion and a second portion, respectively, of the gradient magnet system, and wherein the anti-vibration system comprises a first gyroscope, which is mounted to the first portion of the gradient magnet system, and a second gyroscope, which is mounted to the second portion of the gradient magnet system, the first and the second gyroscope each having an axis of rotation which is directed parallel to a main Z-direction of the main magnetic field.

3. An MRI system as claimed in claim 2, wherein, for each gyroscope, a moment of inertia $J_Z$ about the axis of rotation and, during operation, an angular velocity $\omega_Z$ are such that the product $J_Z^* \omega_Z$ is substantially larger than $2\pi^* J_X^* f_{EXC}$, wherein $J_X$ is a total moment of inertia of the respective portion of the gradient magnet system and the respective gyroscope about an axis perpendicular to the axis of rotation, and $f_{EXC}$ is a frequency of the vibrations to be reduced of the respective portion of the gradient magnet system.

4. An MRI system as claimed in claim 2, wherein the first and the second portion of the gradient magnet system each comprise a support, which carries a coil system and which is accommodated in a portion of, respectively, the first and the second magnet unit facing the examination volume, the first and the second gyroscope being arranged at a side of, respectively, the first and the second magnet unit remote from the examination volume and being mounted to, respectively, the first and the second portion of the gradient magnet system by means of a mounting member which is accommodated in a central passage provided in, respectively, the first portion and the second portion of the main magnet system.

5. An MRI system as claimed in claim 2, wherein the first and the second portion of the gradient magnet system each comprise a support, which carries a coil system and which is accommodated in a portion of, respectively, the first and the second magnet unit facing the examination volume, the first and the second gyroscope being arranged in the support of, respectively, the first and the second portion of the gradient magnet system.

6. An MRI system as claimed in claim 2, wherein the first and the second gyroscope are coupled to, respectively, the first and the second portion of the gradient magnet system by means of a separate actuator system and a separate coupling device allowing at least rotations of the respective gyroscope relative to the respective portion of the gradient magnet system about a first and a second axis of rotation, which extend perpendicularly to each other and to the Z-direction, the MRI system having a control system for controlling each actuator system in such a manner that, during operation, each actuator system exerts, upon the respective portion of the gradient magnet system, at least compensating mechanical torques about the first and the second axis of rotation which reduce residual vibrations of the respective portion of the gradient magnet system.

7. An MRI system as claimed in claim 1, wherein the gyroscope is coupled to the gradient magnet system by means of an actuator system and a coupling device allowing displacements of the gyroscope relative to the gradient magnet system, the MRI system having a control system for controlling the actuator system in such a manner that, during operation, the actuator system exerts upon the gradient magnet system a compensating mechanical load which reduces residual vibrations of the gradient magnet system.

* * * * *